United States Patent [19]
Hayashi et al.

[11] Patent Number: 5,372,972
[45] Date of Patent: Dec. 13, 1994

[54] METHOD OF AND AN APPARATUS FOR PROCESSING A LEAD FRAME

[75] Inventors: Kazuyuki Hayashi; Masahiro Ishizuka, both of Fukuoka, Japan

[73] Assignee: Mitsubishi Denki Kabushiki Kaisha, Tokyo, Japan

[21] Appl. No.: 44,625

[22] Filed: Apr. 9, 1993

[30] Foreign Application Priority Data

Aug. 6, 1992 [JP] Japan .................. 4-210151

[51] Int. Cl.$^5$ ............................. H01L 21/60
[52] U.S. Cl. .................... 437/209; 437/214; 437/217; 437/220; 437/211
[58] Field of Search ............... 437/209, 211, 214, 217, 437/220

[56] References Cited

U.S. PATENT DOCUMENTS

| | | | |
|---|---|---|---|
| 3,887,996 | 6/1975 | Hartleroad et al. | 29/583 |
| 5,183,724 | 2/1993 | Johnson | 437/220 |
| 5,186,719 | 2/1993 | Egashira et al. | 437/220 |
| 5,264,002 | 11/1993 | Egashira et al. | |

FOREIGN PATENT DOCUMENTS

| | | |
|---|---|---|
| 63-80549 | 4/1988 | Japan . |
| 63-213363 | 9/1988 | Japan . |
| 288557 | 11/1989 | Japan . |
| 155141 | 7/1991 | Japan . |
| 155153 | 7/1991 | Japan . |

Primary Examiner—Brian F. Hearn
Assistant Examiner—Kevin M. Picardat
Attorney, Agent, or Firm—Oblon, Spivak, McClelland, Maier, & Neustadt

[57] ABSTRACT

Improved transportation accuracy of a lead frame and reduced transportation time is attained. On the both sides of a heat block (1), rails (3a) equipped with a vertical drive mechanism are provided. By rotation of a screw shaft (7), a lead frame (4) is moved from front side to rear side of the heat block (1) along guide rails (3b) and the movable rails (3a) while holding the lead frame (4) by a clamp (5c) which has freedom of horizontal and vertical movements. During this transportation, a sensor (8) detects the position of the lead frame (4). A frame presser member (2) is mounted above the heat block (1) and equipped with a vertical drive mechanism for pressing the lead frame (4) against the heat block (1). The lead frame (4) is fed to a predetermined point by one motion of the clamp (5c) while firmly held by the clamp (5c) without frictionally contacting the heat block (1).

10 Claims, 20 Drawing Sheets $(-X) \longleftrightarrow (+X)$ $(-X) \longleftrightarrow (+X)$ $(-X) \longleftrightarrow (+X)$

METHOD OF AND AN APPARATUS FOR PROCESSING A LEAD FRAME

BACKGROUND OF THE INVENTION

1. Field of the Invention

The present invention relates to a method of and an apparatus for executing processing such as bonding on a lead frame.

2. Description of the Background Art

FIG. 1 is a perspective view of a conventional lead frame processing apparatus. An apparatus 100 is constructed as a bonding apparatus for feeding in a direction X a lead frame 4 which fixedly carries semiconductor chips SC and for subsequently wire bonding the semiconductor chips SC to the lead frame 4 at a position where a heat block 33 is located.

On the both sides of the heat block 33, two movable guide rails 28 are provided in a faced relation to each other for free movement upward above and downward below a top surface 33a of the heat block 33. In the facing surface of each movable guide rail 28, a guide trench 28a is formed. The guide trenches 28a each have a tapering portion 28b at an end so as to smoothly receive the lead frame 4.

A frame presser member 27 is disposed above the heat block 33. Comprising an up-down mechanism, the frame presser member 27 is movable upward and downward, and hence, is capable of pressing the lead frame 4 against the top surface 33a of the heat block 33.

The two movable guide rails 28 are each faced with at each end a stationary guide rail 29. A guide step 29a is formed in the facing surface of each stationary guide rail 29.

A screw shaft 32b is disposed parallel to the guide rails 28 and 29. Although not shown in FIG. 1, the screw shaft 32b is engageably received by an external screw which is fixed to a holder 32a. Entrance clamp fingers 30a and 30b and exit clamp fingers 31a and 31b are held in the holder 32a at their base portions. The entrance and the exit clamp fingers 30a, 30b, 31a and 31b grip the lead frame 4 therebetween and feed the lead frame 4 on the guide rails 28 and 29. With the external screw driven by a step motor and the like and hence in rotation, the holder 32a reciprocally slides along the guide rails 29, and therefore, the clamp fingers 30a, 30b, 31a and 31b accordingly move back and forth along the guide rails 29 in the feed direction X of the lead frame 4.

<Operation>

FIGS. 2 to 10 are diagrams showing operation of the apparatus 100.

First, the lead frame 4 is forwarded onto the guide trenches 29a of the entrance guide rails 29 by a transportation mechanism not shown (FIG. 2) Next, the lower entrance clamp finger 30a moves upward and the upper entrance clamp finger 30b moves downward so that the entrance clamp is closed (FIG. 3). The screw shaft 32b then rotates to move the upper and the lower entrance clamp fingers 30a and 30b in a direction −X, thereby pushing back and registering the lead frame 4 to a predetermined position (FIG. 4).

The entrance clamp is opened by moving the lower entrance clamp finger 30a downward and the upper entrance clamp finger 30b upward, followed by that the entrance clamp is moved a preselected distance in the direction −X by rotation of the screw shaft 32b (FIG. 5).

The lower and the upper entrance clamp fingers 30a and 30b move toward each other so that the lead frame 4 is fixedly held in a tight nip therebetween (FIG. 6). The screw shaft 32b then reversely rotates, thereby sliding the entrance clamp in the direction +X. Upon feeding of the lead frame 4 by a preselected distance (FIG. 7), the lower and the upper entrance clamp fingers 30a and 30b move away from each other to release the lead frame 4 (FIG. 8).

Thereafter, the entrance clamp again moves in the direction −X by rotation of the screw shaft 32b and return to its position of FIG. 5 (FIG. 9).

By repeated clamping actions of the entrance clamp as shown in FIGS. 2 to 9, the lead frame 4 is intermittently advanced in the direction +X, in the course of which a predetermined portion of the lead frame 4 reaches to a bonding position on the heat block 33 (FIG. 10).

As shown in FIG. 10, the movable guide rails 28 are upwards while waiting for the lead frame 4 to reach at the heat block 33. Hence, the lead frame 4 will see no chance of getting caught in frictional contact with the heat block 33 during transportation therefor onto the heat block 33.

Next, the frame presser member 27 slides down to urge the lead frame 4 against the heat block 33. At the same time, the guide rails 28 also slide downward.

The lead frame 4 as it is held in this manner is wire bonded to the semiconductor chips SC which are mounted on the lead frame 4. Wire bonding is executed through an opening 35 of the frame presser member 27.

The frame presser member 27 moves upward on completion of the wire bonding and the reciprocal motion of the entrance clamp immediately resumes. The lead frame 4 passed the movable guide rails 28 is held between the lower and the upper exit clamp fingers 31a and 31b and fed in the direction +X.

By repeating the process steps above, the semiconductor chips SC mounted on the lead frame 4 are bonded to a corresponding portion of the lead frame 4 one after another.

As heretofore described, in the conventional lead frame processing apparatus 100, several clamping actions of the clamp on the lead frame are needed until the lead frame has been conveyed to the predetermined bonding position. Hence, the lead frame tends to be largely displaced, and as a result, a feeding accuracy of the conventional apparatus becomes poor. In addition, the necessity of the several clamping actions renders the conventional apparatus inefficient in terms of operation time.

SUMMARY OF THE INVENTION

The present invention is directed to a method of feeding a lead frame from a first point toward a second point along a predetermined transportation line which extends from the first to the second points, executing a predetermined processing on the lead frame while holding still the lead frame in a processing space which is provided in the transportation line, and for further feeding the lead frame to the second point along the transportation line.

In a first embodiment of the invention, the method comprises the steps of: (a) preparing a nip mechanism for firmly holding the lead frame, the nip mechanism having a motion stroke which includes at least a distance which extends from a first position to a second position, the first position being defined between the first point and the processing space, the second position being defined in the processing space; (b) setting a sensor to a predetermined point in the transportation line; (c) feeding the lead frame to the first point; (d) holding the lead frame at the first position by the nip mechanism, moving the nip mechanism as it is holding the lead frame in its nipping area toward the second position to thereby feed the lead frame toward the processing space; (e) detecting a predetermined portion of the lead frame by the sensor; (f) feeding the nip mechanism a predetermined distance to the second position upon detection of the predetermined portion of the lead frame so that a portion-to-be-processed of the lead frame reaches at the processing space; (g) stopping the nip mechanism concurrently with arrival of the portion-to-be-processed of the lead frame at the processing space; (h) executing the predetermined processing on the portion-to-be-processed of the lead frame within the processing space; and (i) holding the lead frame by the nip mechanism and further feeding the lead frame toward the second point.

The present invention is also directed to an apparatus which is suitable for carrying out the method above.

Preferably, a lead frame fix mechanism is disposed in the processing space. The lead frame always remains held by the nip mechanism and/or fixed by the lead frame fix mechanism. Under such condition, the lead frame is intermittently fed and a plurality of portions-to-be-processed are successively processed.

The nip mechanism has a large motion stroke. Hence, the nip mechanism is also capable of discharging the lead frame.

If the predetermined processing is bonding on the lead frame, to deal with this, a heat block is disposed in the processing space.

If guide rails for guiding the lead frame along the transportation line are provided, it is preferable to dispose the guide rails such that frictional contact of the lead frame and the heat block would not occur.

In a second embodiment, to prevent such frictional contact, the guide rails are movable in a vertical direction and so is the nip mechanism.

In a third embodiment of the invention, the heat block is movable in a vertical direction.

Both in the second and the third aspects, transportation of the lead frame is attained using only one nip mechanism.

A sensor detects a predetermined portion of the lead frame and generates a detection signal which governs feeding of the lead frame until a portion-to-be-processed of the lead frame reaches at the processing space.

In addition, the nip mechanism used during feeding of the lead frame has a large motion stroke. Hence, transportation of the lead frame is achieved without passing the lead frame from a nip mechanism to a nip mechanism.

As a result, the lead frame is fed at an enhanced transportation accuracy in a reduced time.

If a plurality of portions-to-be-processed are defined in the lead frame, the nip mechanism must move back and forth. In returning to the first position, the nip mechanism does not hold the lead frame. However, the lead frame would not be displaced since the lead frame is always held by the nip mechanism and/or fixed by the lead frame fix mechanism.

Further, since the nip mechanism is also used to discharge the lead frame, successive procedures from the beginning to the end of transportation of the lead frame are executed at a high accuracy.

In bonding application, the invention attains a large motion stroke of the nip mechanism and no frictional lead frame/heat-block contact.

Accordingly, it is an object of the present invention to offer a method of an apparatus for attaining a high-feeding accuracy, short-feeding time processing on a lead frame.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

<1a. Overall Structure of Transportation System>

Figure 1:
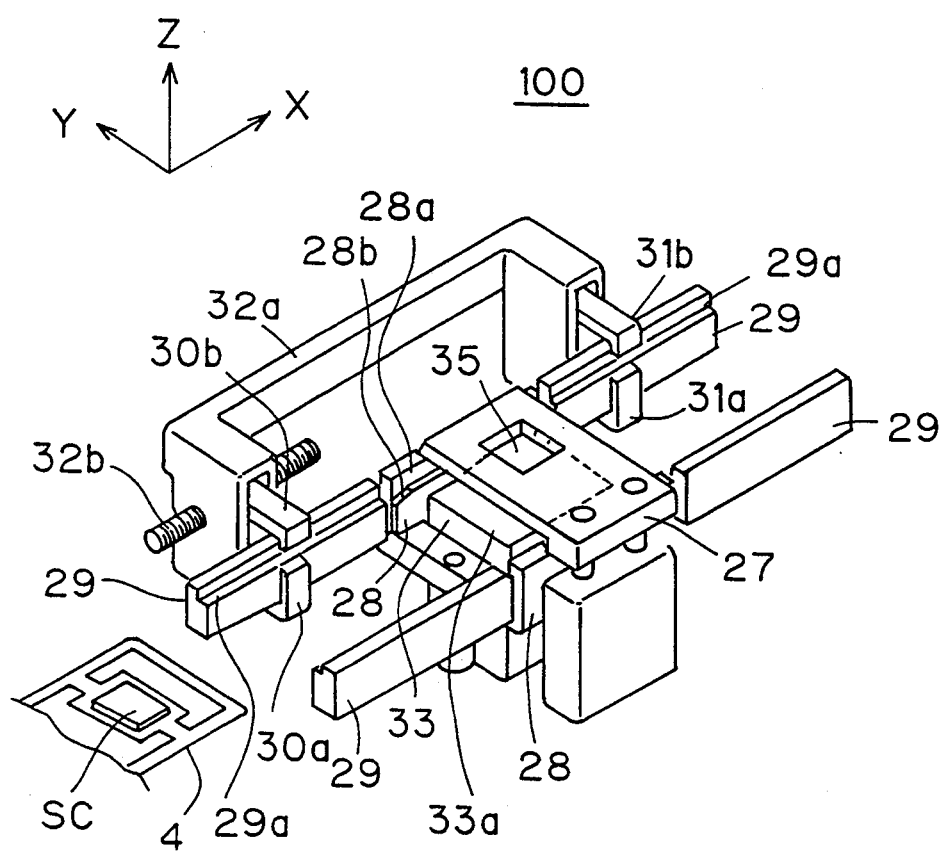
FIG. 1 is a perspective view of a conventional bonding apparatus.
Figure 2:
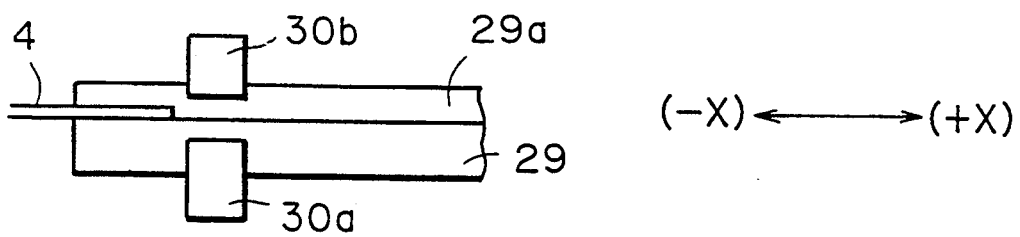
FIGS. 2 to 10 are diagrams showing bonding using the conventional bonding apparatus in respective process steps.
Figure 3:
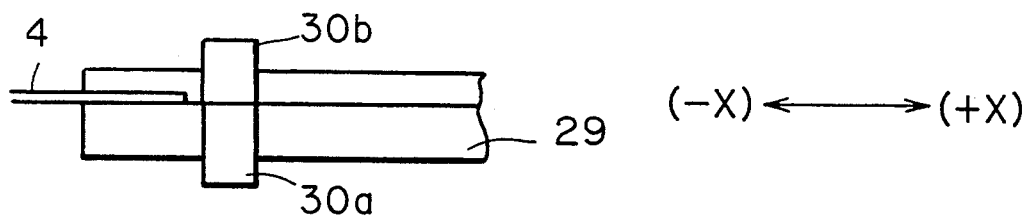
Figure 4:
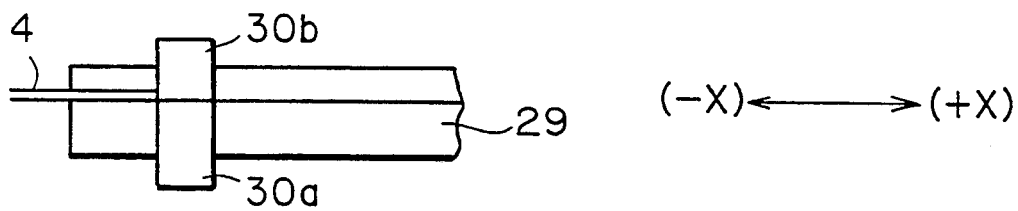
Figure 5:
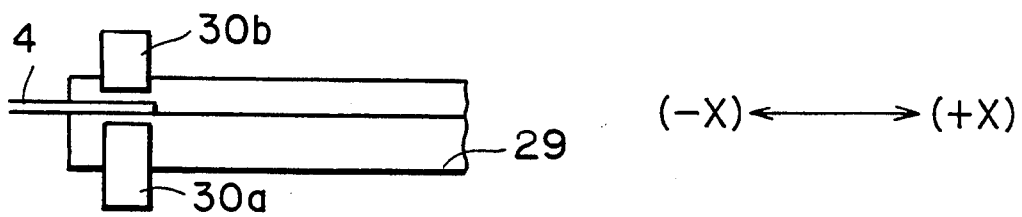
Figure 6:
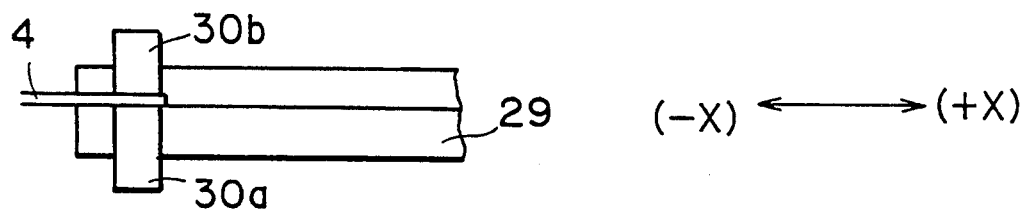
Figure 7:
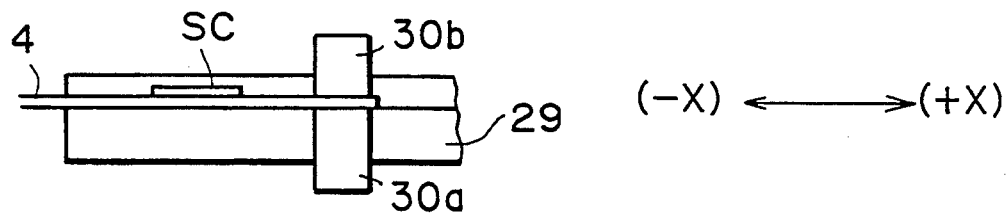
Figure 8:
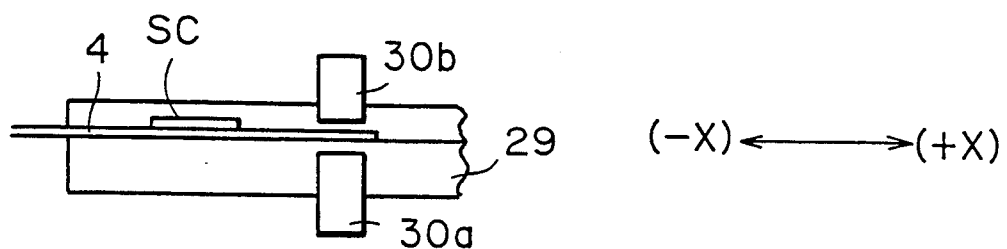
Figure 9:
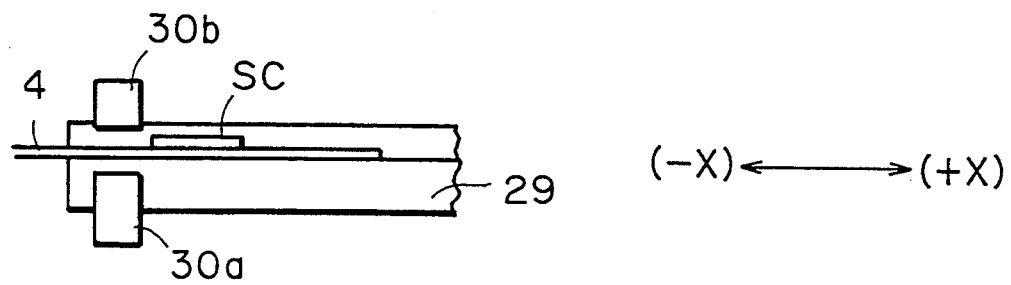
Figure 10:
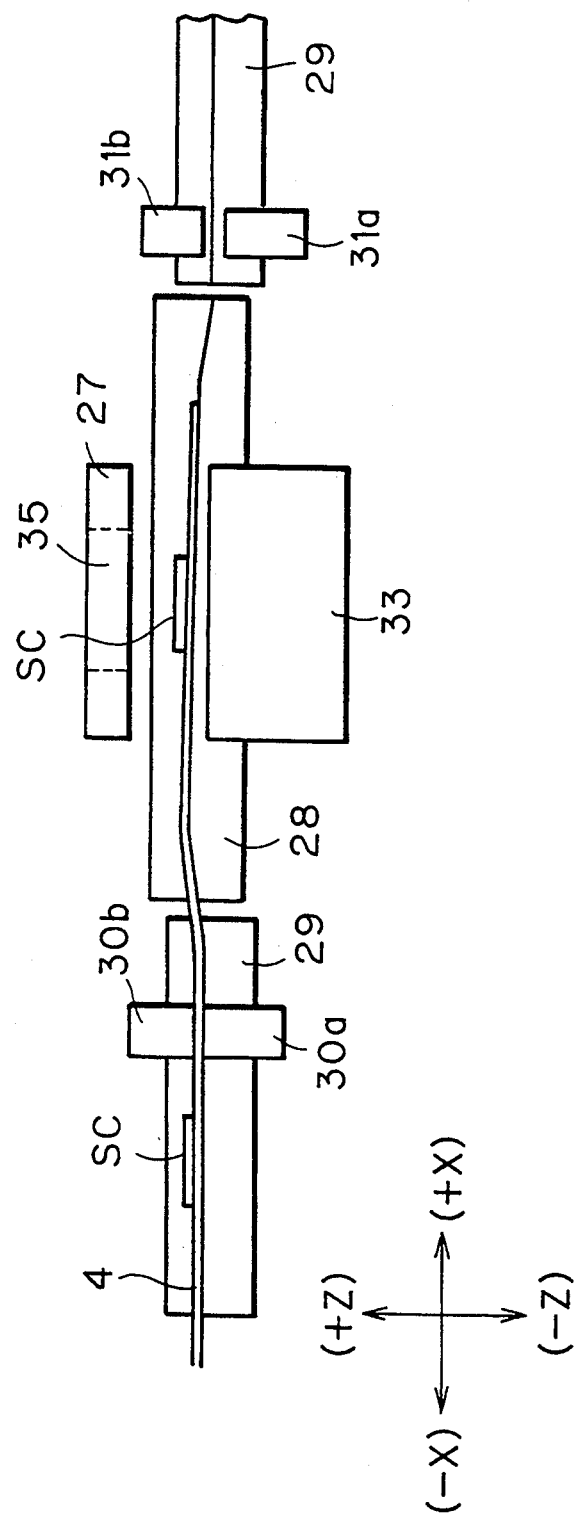
Figure 11:
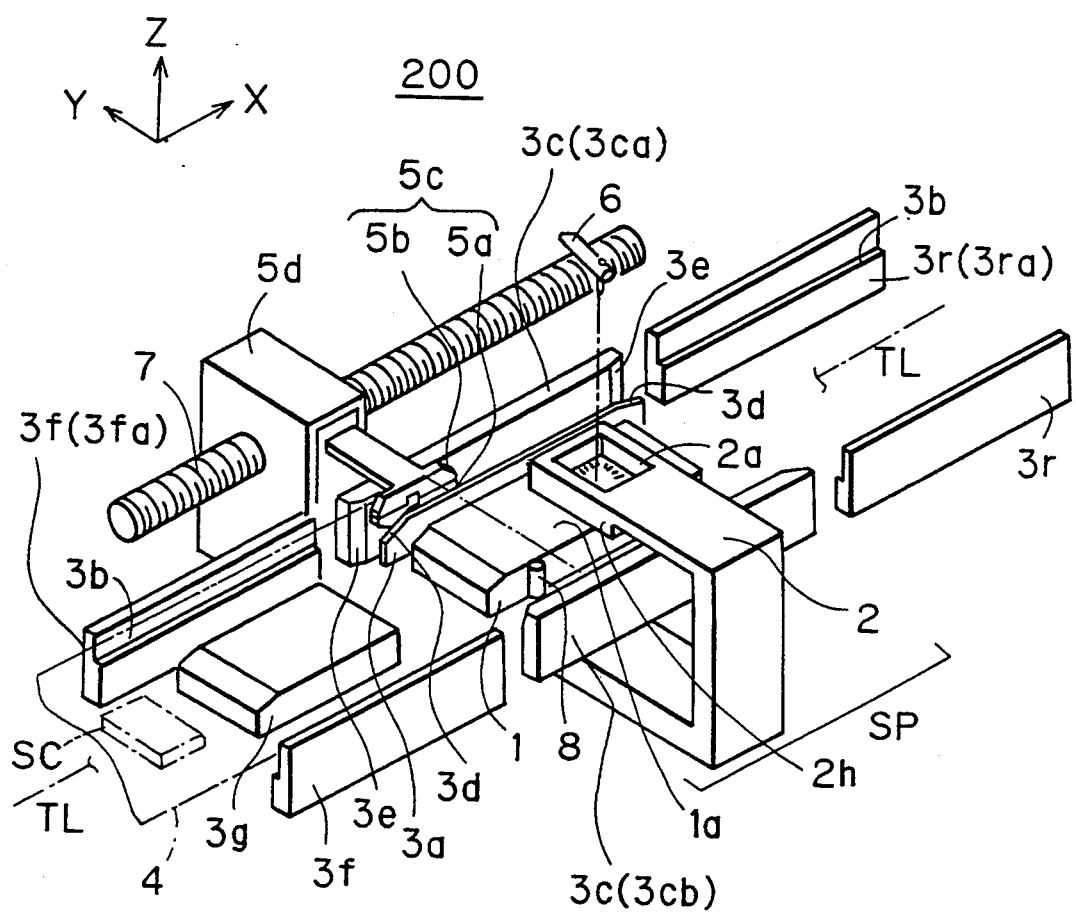
FIG. 11 is a perspective view of a bonding apparatus according to a preferred embodiment of the present invention.
Figure 12:
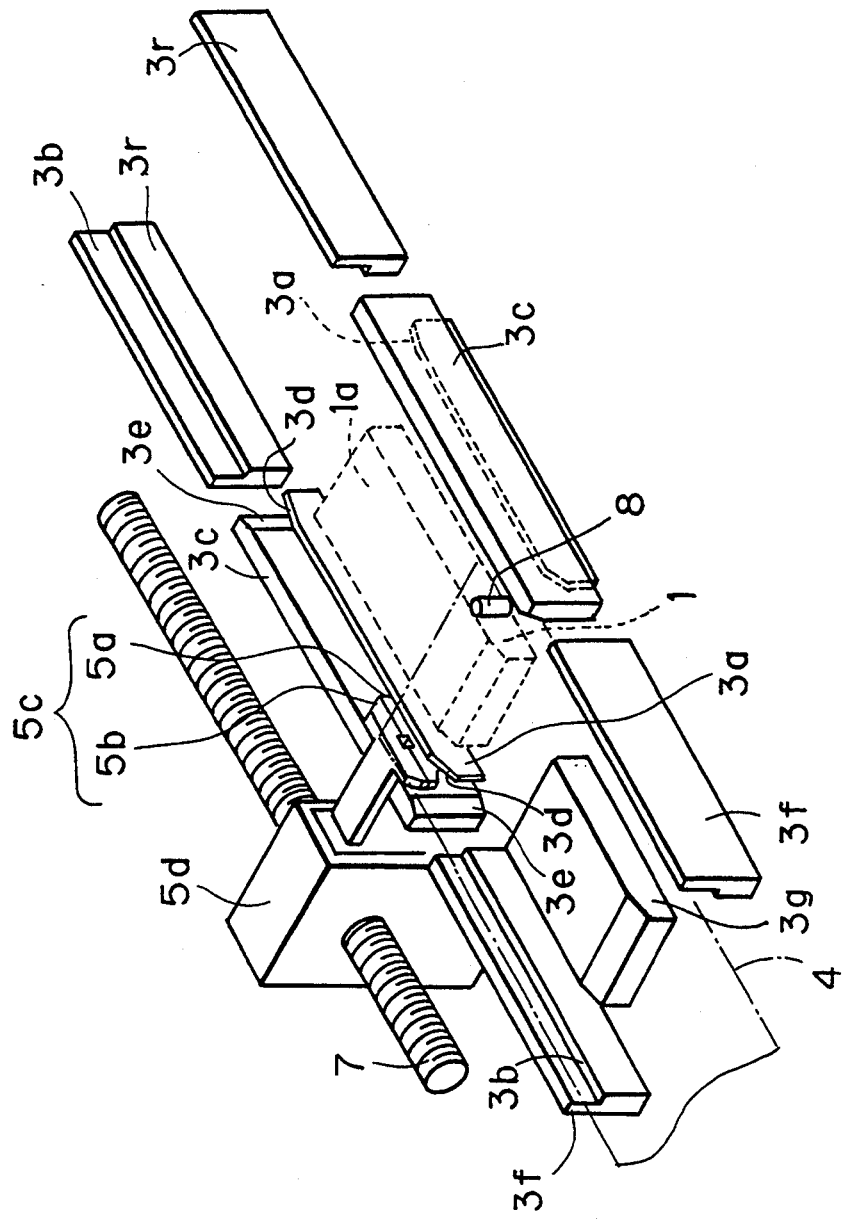
FIG. 12 is a perspective view of a lead frame transportation apparatus according to the preferred embodiment of the present invention.

FIG. 11 is a perspective view of a lead frame processing apparatus 200 according to a first preferred embodiment of the present invention. FIG. 12 is a perspective view of a lead frame transportation apparatus 200a which is incorporated in the lead frame processing apparatus 200 of FIG. 11.

The lead frame processing apparatus 200 is constructed as a bonding apparatus for feeding in a direction X a lead frame 4 mounting semiconductor chips SC and for subsequently wire bonding the semiconductor chips SC to the lead frame 4 above a heat block 1. In the first preferred embodiment, a transportation line TL along which the lead frame 4 is to be fed extends in the direction X. In FIG. 11, the transportation line TL runs from a left downward point (first point) to a right upward point (second point).

Although FIG. 11 shows only one semiconductor chip SC, in reality, a number of the semiconductor chips SC are periodically arranged on the lead frame 4. The semiconductor chips SC are temporarily fixed on the lead frame 4.

The lead frame processing apparatus 200 of FIG. 11 comprises the heat block 1 which has a top surface 1a on which the lead frame 4 is to be heated. The top surface 1a is substantially flush with the vertical position of the transportation line TL.

As shown in FIG. 12, on both sides of the heat block 1, two parallel movable rails 3a elongating in the feeding direction X are disposed for free up-and-down (direction Z) movement above and below the top surface 1a of the heat block 1. Paired guide plates 3c are each mounted opposite and parallel to the facing surface of each movable rail 3a so as to restrict Y-direction position of the lead frame 4. The movable rails 3a and the guide plates 3c have tapering portions 3d and 3e, respectively, at their ends to smoothly receive the lead frame 4.

Two parallel entrance guide rails 3f are provided in front of the respective guide rails 3a in order to forward the lead frame 4 into the guide rails 3a. For discharge of the lead frame 4, two parallel exit guide rails 3r are installed behind the guide rails 3a. The guide rails 3f and 3r are disposed at the same height in alignment to the guide plates 3c. A guide step 3b is formed on the facing surface of each one of the guide rails 3f and 3r. The guide planes, i.e., the guide steps 3b of the guide rails 3f and 3r are flush with each other and substantially even with the vertical position of the transportation line TL.

A support base member 3g for supporting the lead frame 4 is disposed midway between the two entrance guide rails 3f.

A screw shaft 7 is mounted outside and parallel to the guide rails 3f and 3r. The screw shaft 7 is in engagement with an external screw which is enveloped in a clamp drive mechanism 5d. A step or other suitable motor is used as a drive source for driving, directly or otherwise indirectly via a gear and the like, the screw shaft 7. With rotation of the screw shaft 7, the clamp drive mechanism 5d horizontally moves in the direction X of FIG. 11 or in the opposite direction.

The clamp drive mechanism 5d is linked to a clamp 5c which is formed by a lower clamp finger 5a and an upper clamp finger 5b. The lead frame 4 is to be held between the lower and the upper clamp fingers 5a and 5b.

By holding the lead frame 4 by the clamp 5c and moving the clamp 5c together with a translation motion part (described later with FIG. 13) of the clamp drive mechanism 5d, the lead frame 4 is fed along the movable rails 3a and the guide rails 3f and 3r.

The clamp 5c is movable in the direction X in a wide motion range between ends of the heat block 1 as described later. To attain the wide range movement, of the paired guide rails 3c, the guide rail 3ca just beside the clamp 5c is linked to the guide rails 3fa and 3ra by link members (not shown) at both ends; that is, if the guide rail 3ca is supported by a support member from below, the lower clamp finger 5a would hit the support member during travel of the clamp 5c in the direction X. As to the other guide rail 3cb, since the clamp 5c needs not to move near the guide rail 3cb, the guide rail 3cb may be supported from any direction.

A frame presser member 2 (FIG. 11) is provided above the heat block 1. The frame presser member 2 is linked to a vertical drive mechanism (described later with FIG. 15) for moving the frame presser member 2 upward and downward. If the lead frame 4 has been conveyed to the heat block 1, the frame presser member 2 moves downward. Hence, pressed against the top surface 1a of the heat block 1 by a head 2h of the frame presser member 2, the lead frame 4 is provisionally fixed on the heat block 1.

The head 2h of the frame presser member 2 includes an opening (window) 2a above which a bonding tool 6 is disposed. The bonding tool 6 moves downward from its position of FIG. 11 and wire bonds the semiconductor chip SC to the lead frame 4 through the opening 2a.

<1b. Detailed Structure of Clamp Drive Mechanism 5d>

Figure 13:
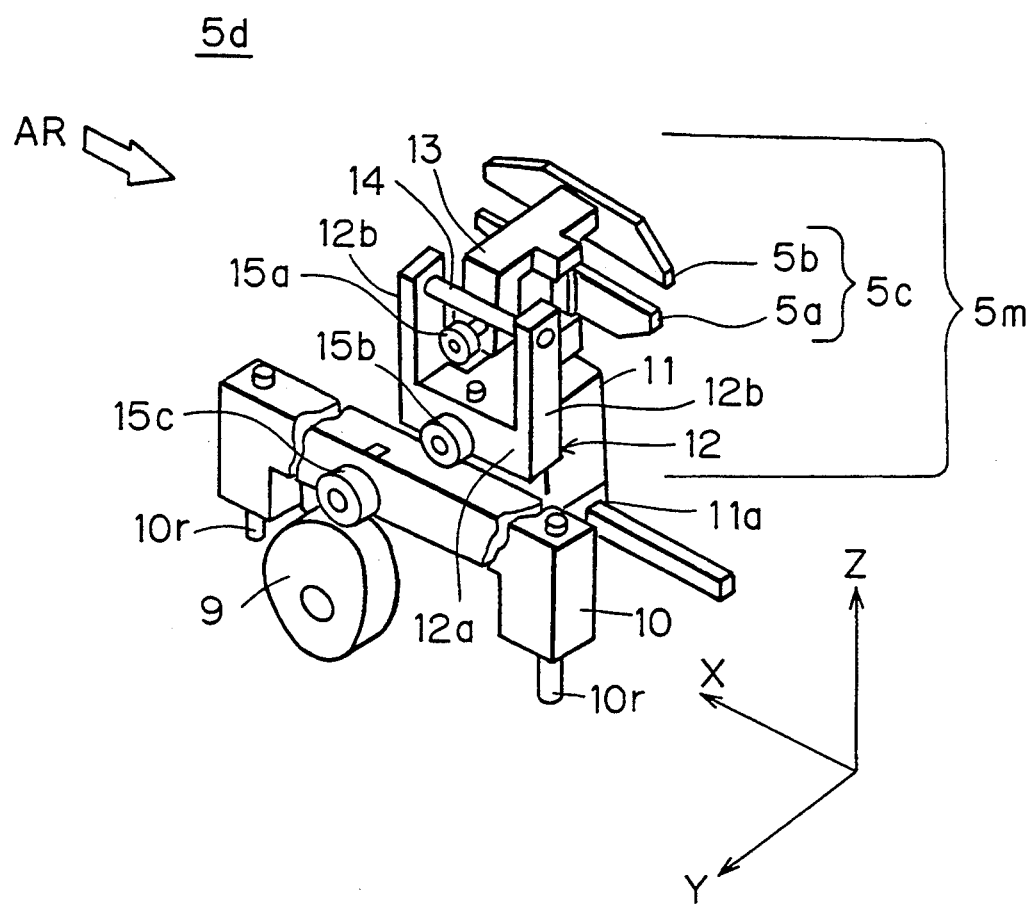
FIG. 13 is a perspective view of an open-close drive mechanism for driving clamp fingers according to the preferred embodiment of the present invention.
Figure 14:
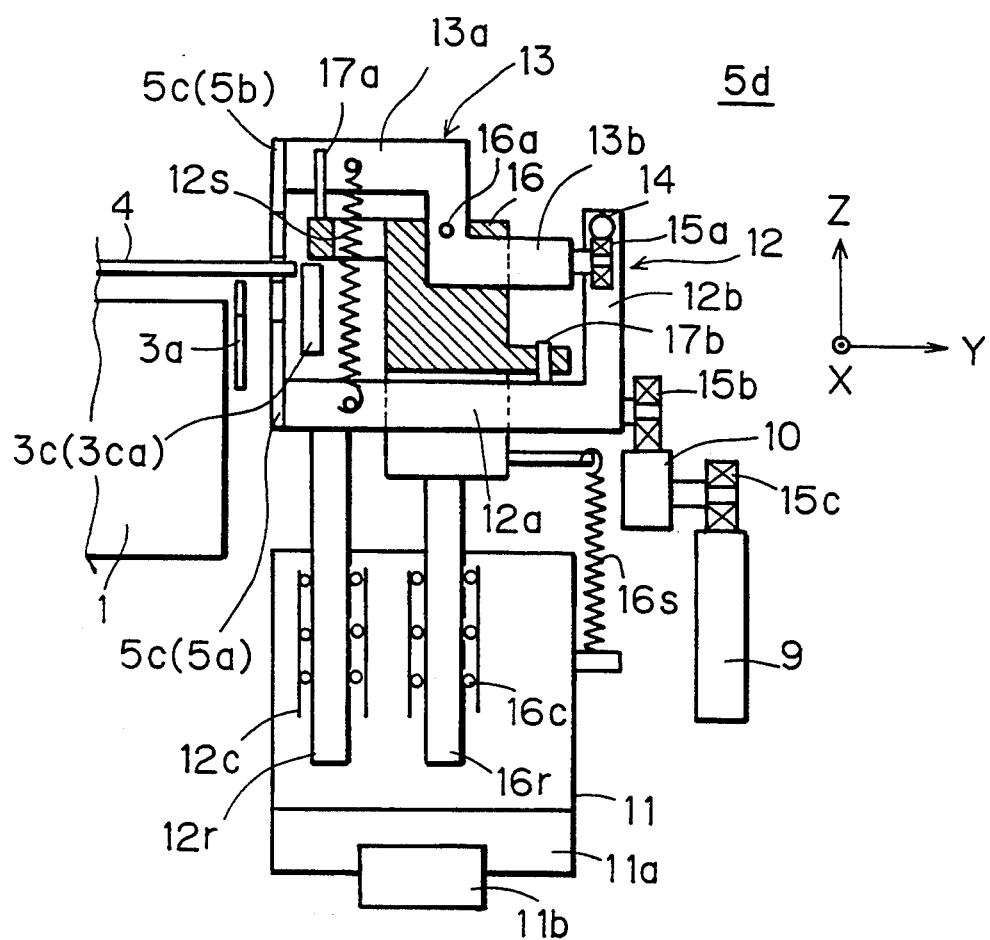
FIG. 14 is a cross sectional view of FIG. 13 as viewed from an arrow AR of FIG. 13.

FIG. 13 is a perspective view showing the clamp drive mechanism 5d in detail, and FIG. 14 is a side view of the clamp drive mechanism 5d as viewed from an arrow AR of FIG. 13.

The clamp drive mechanism 5d includes a lower finger holder 12 and an upper finger holder 13.

(1) Lower Finger Holder 12

The lower finger holder 12 is comprised of a base portion 12a linked to the lower clamp finger 5a and a pair of column portions 12b extending from the base portion 12a in a direction Z. A lever rod 14 is spanned between the top ends of the paired column portions 12b. A rod 12r is fixed to the bottom surface of the base portion 12a and extends therefrom in a substantially vertical direction. The base portion 12a is further provided with a bearing 15b which is fixed thereto at a rear end portion for free rotation.

(2) Upper Finger Holder 13

The upper finger holder 13 includes a forward end portion 13a linked to the upper clamp finger 5b and a rear end portion 13b which extends from the forward end portion 13a in a step-like configuration. A border portion between the forward and the rear end portions 13a and 13b is axially supported to a horizontal fulcrum shaft 16a for free swing movement in Y-Z plane. The horizontal fulcrum shaft 16a is linked to a support block 16 (described later). A bearing 15a is rotatably mounted to the rear end portion 13b. The bearing 15a is in contact with the lever rod 14 at a peripheral portion.

(3) Support Block 16

The support block 16 (FIG. 14) is provided for supporting the upper finger holder 13 through the horizontal fulcrum shaft 16a. Fixed to the bottom surface of the support block 16, a rod 16r extends in a substantially vertical direction. In FIG. 13, the support block 16 is not drawn for clarity of illustration.

(4) Clamp Support House 11

A clamp support house 11 is disposed below the finger holders 12 and 13. The rods 12r and 16r are supported for free vertical movement in bearings 12c and 16c which are mounted in the clamp support house 11.

A guide member 11a is linked to the bottom surface of the clamp support house 11. The guide member 11a is slidable in the direction X on a rail 11b. This guide mechanism is commercially available as "LM guide." The rail 11b runs parallel to the screw shaft 7 of FIG. 11. The clamp support house 11 also fixedly mounts an external screw (not shown) which engageably receives the screw shaft 7.

(5) Springs and Stoppers

A forward portion of the upper finger holder 13 is connected to the lower finger holder 12 by a spring 12s. A stopper 17a is attached to the forward portion of the upper finger holder 13 while a stopper 17b is attached to the support block 16. The clamp support house 11 and the support block 16 are linked to each other by a spring 16s.

(6) Slidable Rail 10

A slidable rail 10 extending in the direction X is disposed behind the clamp support house 11 as shown in FIG. 13. Guided by upright rods 10r at ends, the slidable rail 10 can freely slide up and down. A bearing 15c is secured, in contact with a cam 9, to the rear surface of the slidable rail 10.

<1c. Function of Clamp Drive Mechanism 5d>

(1) Parallel Travel in X-direction

When the screw shaft 7 of FIG. 11 rotates, translation motion power of the direction X or the opposite direction acts on the translation motion part 5m of the clamp drive mechanism 5d through the external screw which is fixed to the clamp support house 11. This allows the bearing 15b, which is attached to the rear surface of the base portion 12a of the lower finger holder 12, to rotate and move on the slidable rail 10 and the guide member 11a to slide on the rail 11b. Hence, the translation motion part 5m moves on the rails 10 and 11b in the direction X or the opposite direction. The rail 11b covers the whole length of the apparatus 200 of FIG. 11 in the direction X, and therefore, the translation motion part 5m can move in a range as wide as from a predetermined position of the entrance guide rail 3f to a predetermined position of the exit guide rail 3r passed the heat block 1. In other words, the stroke of the translation motion part 5m of the clamp drive mechanism 5d in the direction X extends to the front and the rear sides of the heat block 1. Likewise the rail 11b, the rail 10 runs to the front and the rear sides of the heat block 1. To attain this, a plurality of relatively short slidable rails may be connected in the direction X.

(2) Open-Close and Up-Down Action of Clamp

If the cam 9 rotates while the translation motion part 5m is on the slidable rail 10, the slidable rail 10 slides upward or downward through the bearing 15c.

Sliding down of the slidable rail 10 due to rotation of the cam 9 causes the lower finger holder 12 to move downward while guided by the bearing 12c, which in turn moves the lower clamp finger 5a downward. Movement of the lower finger holder 12 in a downward direction also permits that the lever rod 14 pushes the rear portion 13b of the upper finger holder 13 downward, whereby the upper finger holder 13 starts rotating about the fulcrum 16a against tensile force of the spring 12s. As a result, the upper clamp finger 5b moves upward so that the clamp 5c is opened. The translation motion part 5m is situated at a relatively low position in the direction Z while the slidable rail 10 is down.

As the cam 9 rotates and the slidable rail 10 moves upward, the lower finger holder 12 and hence the lower clamp finger 5a slide upward. Sliding up of the lower finger holder 12 also eliminates the force to downward that the lever rod 14 has been applying on the rear portion 13b of the upper finger holder 13. Consequently, pulled down by the spring 12s, the upper finger holder 13 starts rotating about the fulcrum 16a, allowing the upper clamp finger 5b to move downward so that the lead frame 4 is held by the clamp 5c. As the cam 9 pushes the slidable rail 10 upward after the stopper 17b came into contact with the base portion 12a of the lower finger holder 12, the translation motion part 5m moves upward in the direction Z while being guided by the bearing 16c.

Thus, the mechanisms shown in FIGS. 11 to 14 attain opening and closing action of the clamp 5c and translation motion of the translation motion part 5m.

<1d. Drive Mechanism for Movable Rails 3a and Frame Pressing Member 2>

Figure 15:
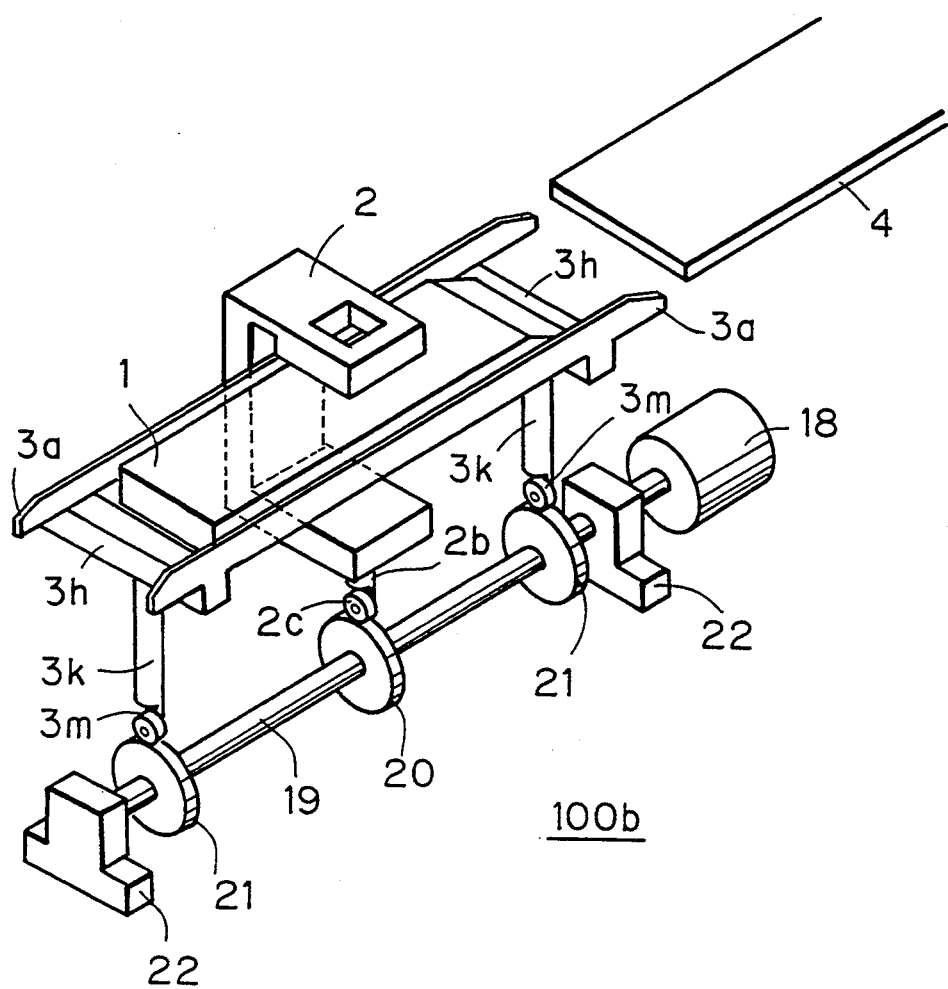
FIG. 15 is a diagram of a vertical drive mechanism for driving movable rails and a frame presser member according to the preferred embodiment of the present invention.

FIG. 15 shows the vertical drive mechanism 100b for moving the movable rails 3a and the frame presser member 2 upward and downward. The mechanism 100b is comprised of a drive motor 18, a rotation shaft 19, a frame presser cam 20, rail cam 21 and a bearing 22. The rotation shaft 19 is axially supported by the bearing 22 for free rotation. Rotation of the drive motor 18 is transmitted to the shaft 19, thereby rotating the rail cam 21 and hence moving up and down a support beam 3h which supports the two rails 3a through a bearing 3m and a shaft 3k. Rotation of the drive motor 18 also rotates the frame presser cam 20, which moves the frame presser member 2 upward and downward via a bearing 2c and a shaft 2b. That is, the movable rails 3a and the frame presser member 2 are moved up and down each with certain strokes by rotating the cams 20 and 21.

<1e. Structure of Control System>

Figure 16:
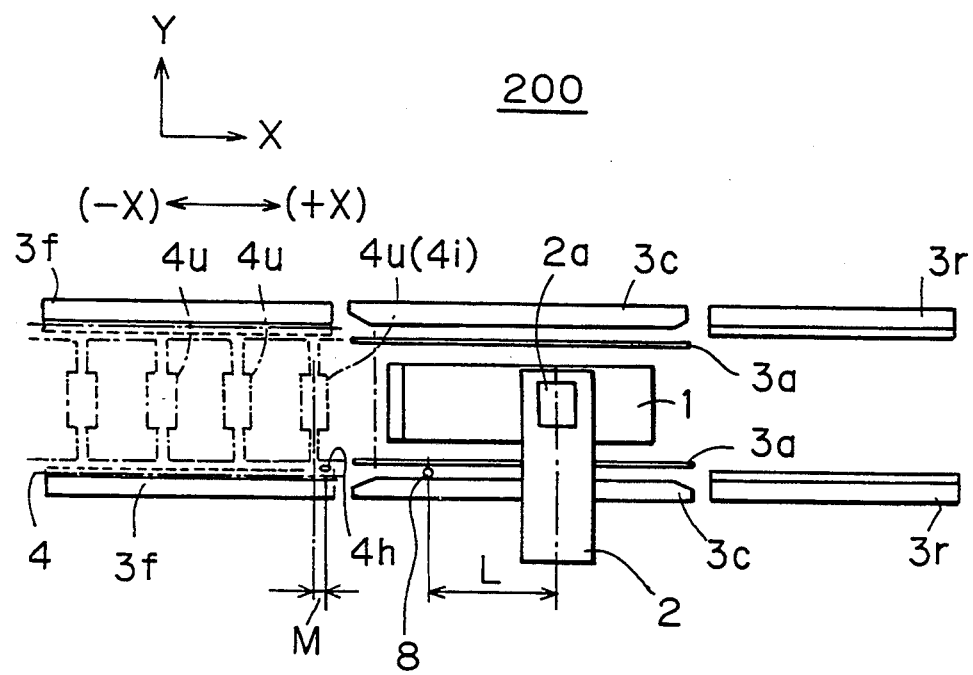
FIG. 16 is a diagram of the bonding apparatus according to the preferred embodiment of the present invention.

FIG. 16 is a plan view of the bonding apparatus 200. A sensor 8 is disposed a distance L away in the direction −X from the frame presser member 2. When the lead frame 4 slides so that a hole 4h formed in the lead frame 4 at a side edge portion comes just below the sensor 8, the sensor 8 optically detects the existence of the hole 4h. Of a plurality of lead frame units 4u, the hole 4h is opened only in the first lead frame unit 4i at a position a predetermined distance M off the center of the lead frame unit 4i.

Figure 17:
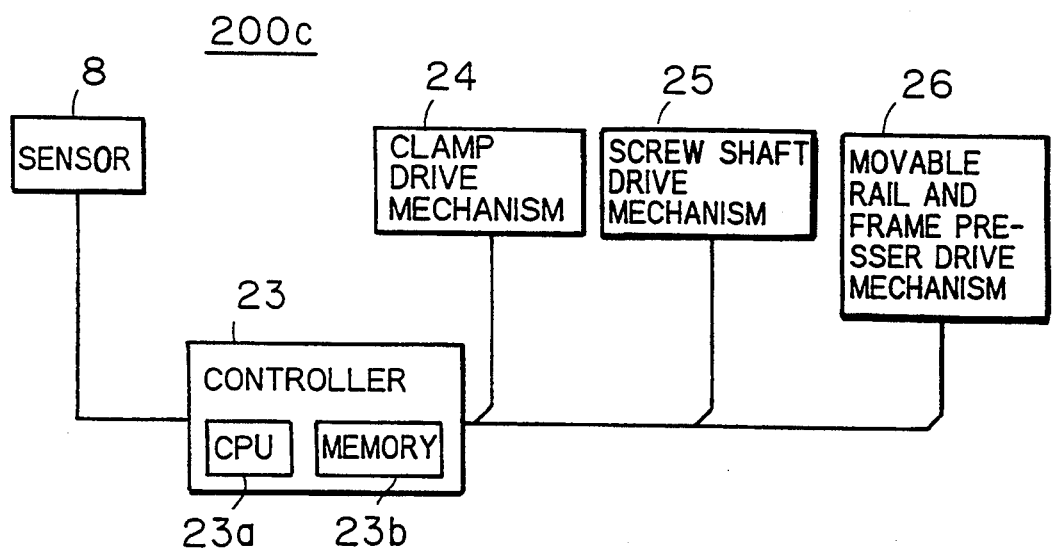
FIG. 17 is a block diagram of a control system according to the preferred embodiment of the present invention.

FIG. 17 is a block diagram of a control system 200c which governs the respective mechanisms in response to an output signal from the sensor 8. The output signal from the sensor 8 is received by a controller 23 which is formed by a microcomputer or the like.

The controller 23 includes a CPU 23a and a memory 23b. Numerical data of the distances L and M are loaded in the memory 23b in advance. In accordance with a reserved operation program, the distances L and M, and the output signal from the sensor 8, the controller 23 generates a drive control signal which will be then given to drive mechanisms 24, 25 and 26.

Of the drive mechanisms 24, 25 and 26, the clamp drive mechanism 24 corresponds to the mechanism that is shown in FIGS. 13 and 14. The screw drive mechanism 25 is a mechanism for rotating the screw shaft 7 of FIG. 11. The drive mechanism 26 for driving the movable rails and the frame presser member corresponds to the mechanism that is shown in FIG. 15.

<1f. Operation of Apparatus 200>

Figure 18:
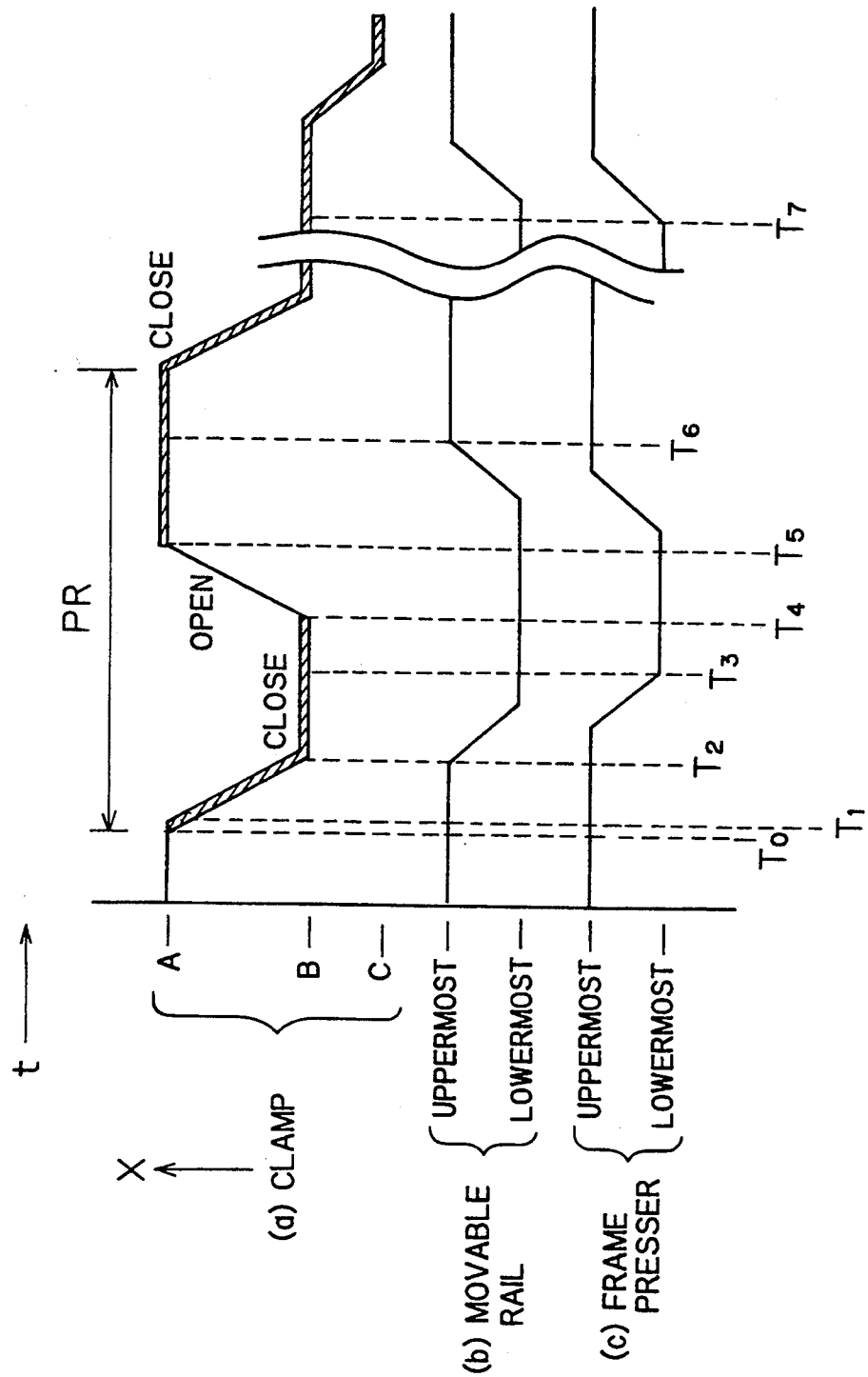
FIG. 18 is a timing chart showing the preferred embodiment of the present invention.

Next, operation of the bonding apparatus 200 having such a construction will be described with FIGS. 18 to 31. In FIG. 18 time t is measured along the horizontal axis. In the section (a) of FIG. 18 showing clamping action, the position of the clamp 5c in the direction X is measured along the vertical axis. The first to the third positions A to C correspond to the positions A to C of FIGS. 19 to 30. The first position A is located prior to a processing space SP as considered in the feeding direction. The second position B is located in the processing space SP. The third position C is located behind the processing space SP as considered in the feeding direction.

During the periods indicated by the hatched double line in the section (a) of FIG. 18, the clamp 5c remains closed. The clamp stays open during the periods indicated by the single line.

Figure 19:
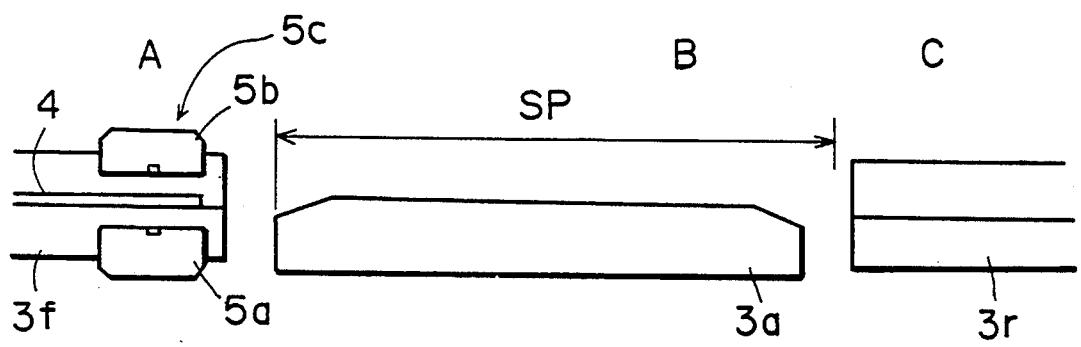
FIGS. 19 to 30 are diagrams showing transportation of a lead frame and bonding in respective process steps in the preferred embodiment of the present invention.
Figure 31:
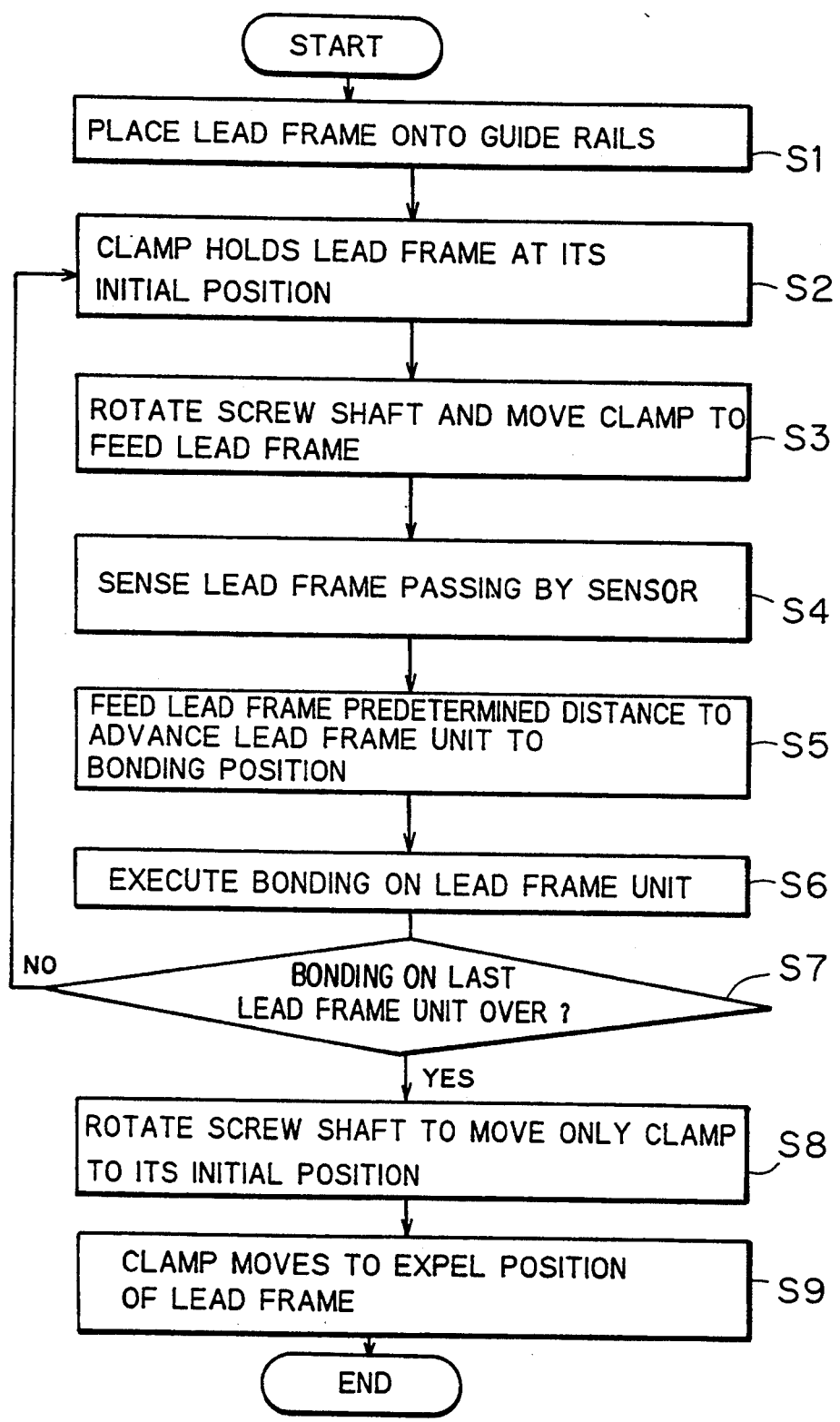
FIG. 31 is a flow chart showing the transportation of a lead frame and the bonding in the preferred embodiment of the present invention.

(1) Step S1 (FIGS. 31 and 19)

The lead frame 4 mounting semiconductor chips on the respective lead frame units is conveyed onto the entrance guide rails 3f. At this stage, the clamp 5c is at the entrance side position A (section (a) of FIG. 18) while the movable rails 3a are pushed up above the heat block 1 (section (b) of FIG. 18). The frame presser member 2, too, is situated at its upper position (the section (c) of FIG. 18).

Figure 20:
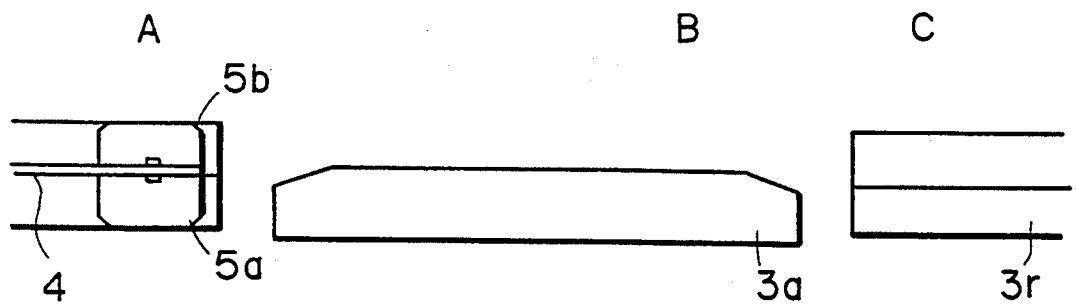

(2) Step S2 (FIG. 20)

The upper clamp finger 5b moves downward and the lower clamp finger 5a moves upward so that the lead frame 4 is held by the clamp 5c at the position A (time T0 in FIG. 18).

Figure 21:
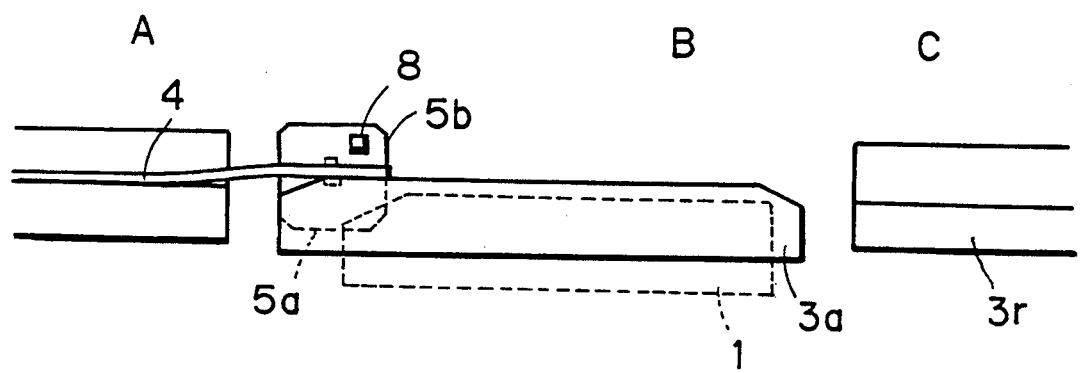

(3) Steps S3 and S4 (FIG. 21)

The screw shaft 7 rotates to feed the lead frame 4 until the hole 4h of the lead frame 4 (FIG. 16) is sensed by the sensor 8 (Time T1 in FIG. 18).

Figure 22:
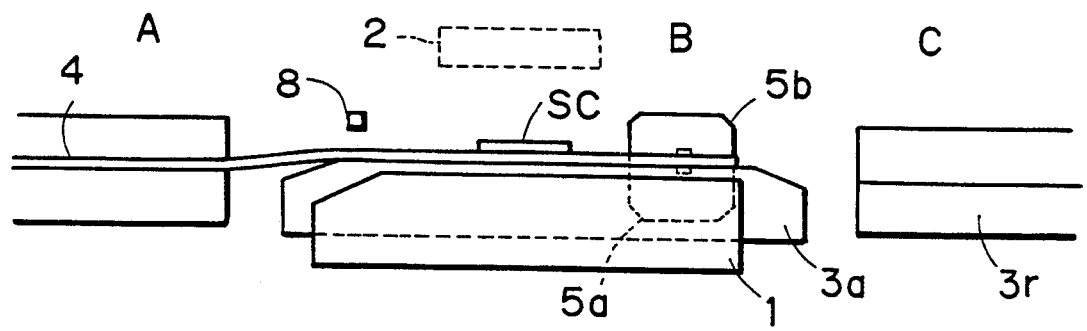

(4) Step S5 (FIGS. 21 and 22)

As shown in FIG. 16, the distance L between the bonding position (the position of the frame presser member 2) and the sensor 8 is determined beforehand, and so the distance M is which is a distance from the hole 4h of the lead frame 4 to the first lead frame unit 4i. At the stage shown in FIG. 21, the center of the first lead frame unit 4i is away from the bonding position by a distance (L+M). A pitch D (not shown) the clamp 5c advances in the direction X by each rotation of the screw shaft 7 is also known in advance.

Hence, by driving the screw shaft 7 so that the screw shaft 7 makes (L+M)/D of a revolution upon detection of the hole 4h, the center of the first lead frame unit 4i is advanced to the bonding position without fail (Time T2 in FIG. 18, FIG. 22), in the course of which the lead frame 4 never frictionally touches the heat block 1 since the movable rails 3a stay in their upper position. During this, the clamp 5c is pushed upward a little and slides along the top surfaces of the rails 3a.

(5) Step S6

Figure 23:
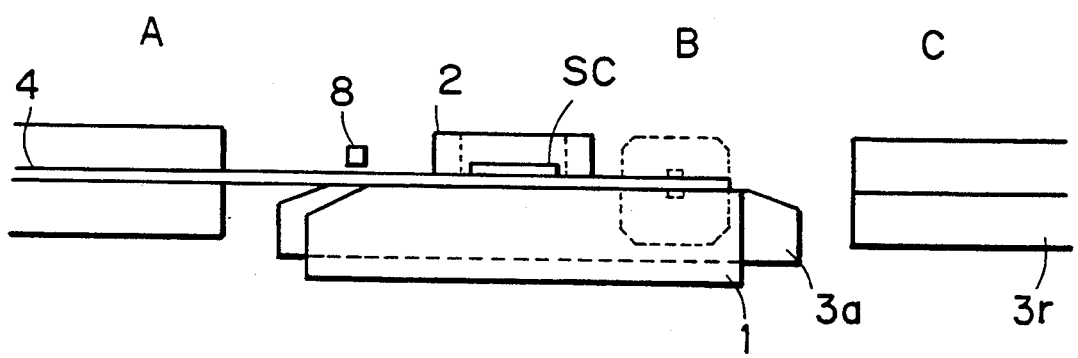

The movable rails 3a move downward to or below the transportation line TL as shown in FIG. 23, followed by that the frame presser member 2 slides downward so as to fixedly press the lead frame 4 against the heat block 1 (Time T3 in FIG. 18).

Figure 24:
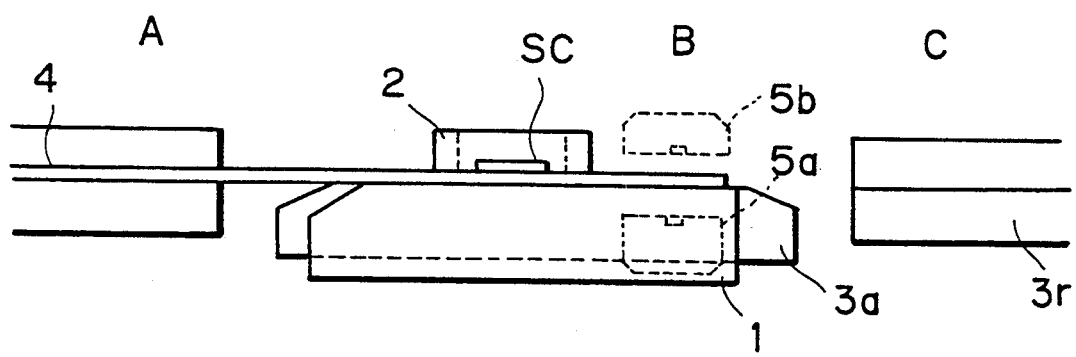

The clamp then opens and wire bonding is completed through the opening of the frame presser member 2 as shown in FIG. 24. At this stage, heated up by the heat block 1, solder melts which has been preliminarily applied between the lead frame 4 and the semiconductor chip SC, thereby welding the lead frame 4 and the semiconductor chip SC.

(6) Step S7

It is judged whether the lead frame unit under bonding treatment is the first lead frame unit 4i. This is attained, for example, by counting finished bondings on the lead frame units, comparing the count I with the number I0 of the lead frame units 4u which are contained in one lead frame 4, and finding whether the count I coincides with the number I0. The number I0 is loaded in the memory 23b in advance.

(7) Step S8

Figure 25:
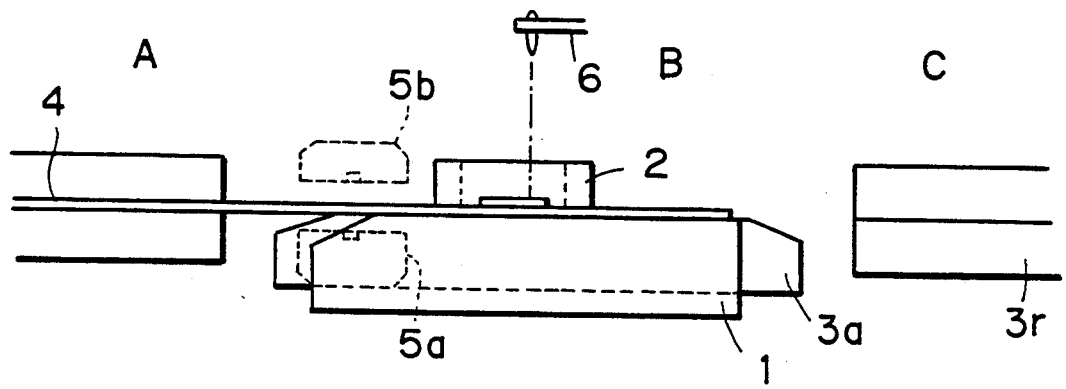
Figure 26:
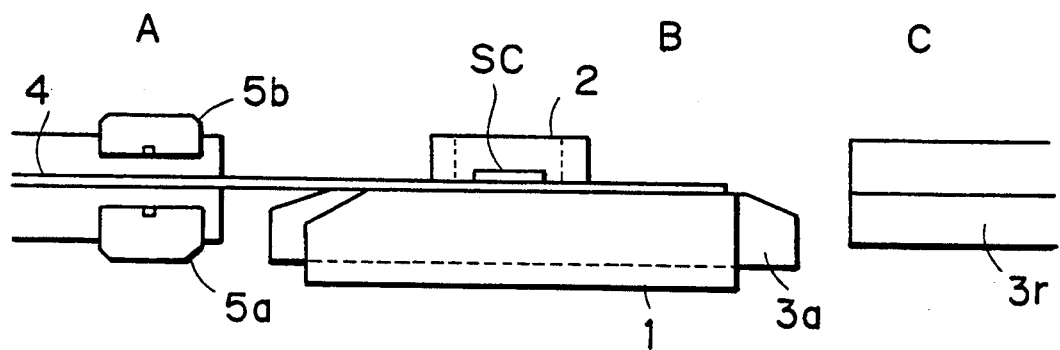
Figure 27:
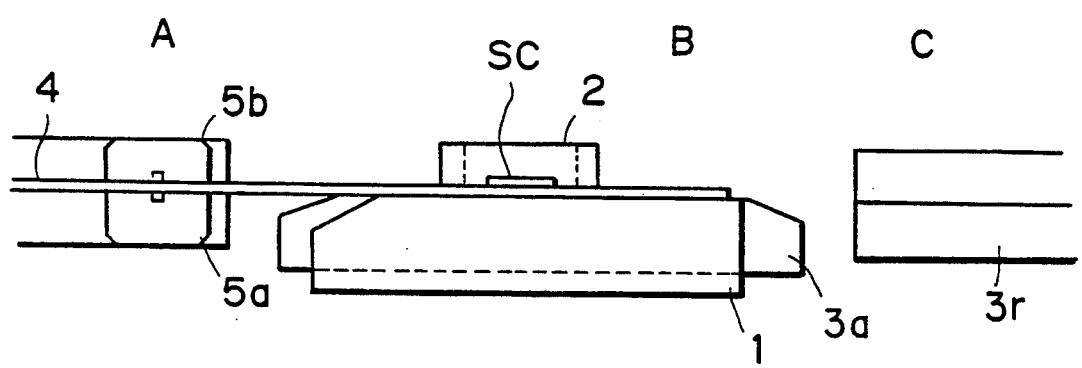
Figure 28:
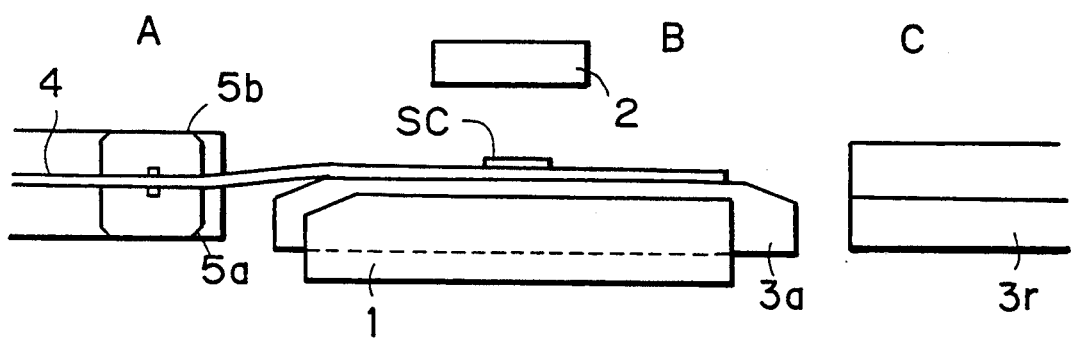

If it is found that the last lead frame unit is yet to be wire bonded, the clamp fingers 5a and 5b move back to the initial position A while wire bonding is still under process (Times T4 to T5 in FIG. 18, FIG. 25). After sliding back to the initial position A (FIG. 26), the clamp 5c closes (FIG. 27). By moving the frame presser member 2 and hence the movable rails 3a upward as shown in FIG. 28 while the lead frame 4 is fixed by the clamp 5c, the lead frame 4 is released between the frame presser member 2 and the heat block 1 in readiness for transportation (Time T6 in FIG. 18). The period PR in FIG. 18 is a time it takes to process one lead frame unit.

(8) Processing on the next lead frame unit

Figure 29:
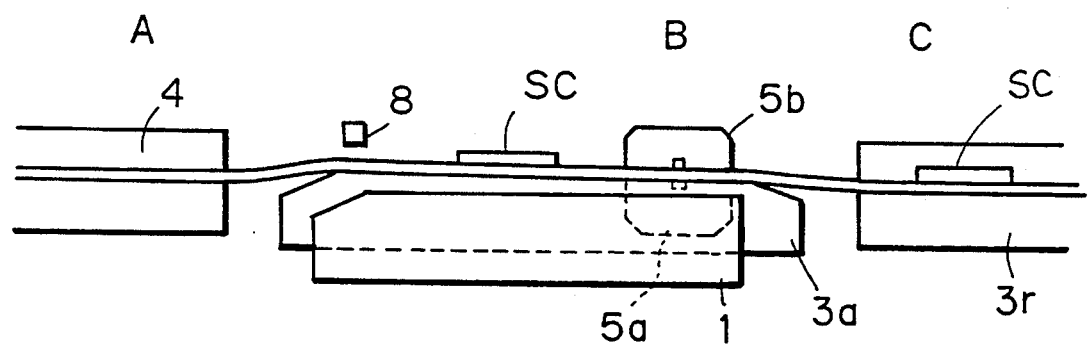

In the first preferred embodiment, the hole 4h to be detected by the sensor 8 is formed in the first lead frame unit 4i, and therefore, detection of a similar hole is not to be performed on the remaining lead frame units. Hence, the process returns to Step S2 and repeats the flow up to here while skipping Step S4. Through this, the second et seq. lead frame units are transported and bonded (FIG. 29). It is to be noticed that transportation of the respective lead frame units may be executed in accordance with detection of holes 4h each formed in each lead frame unit.

(9) Step S9

Figure 30:
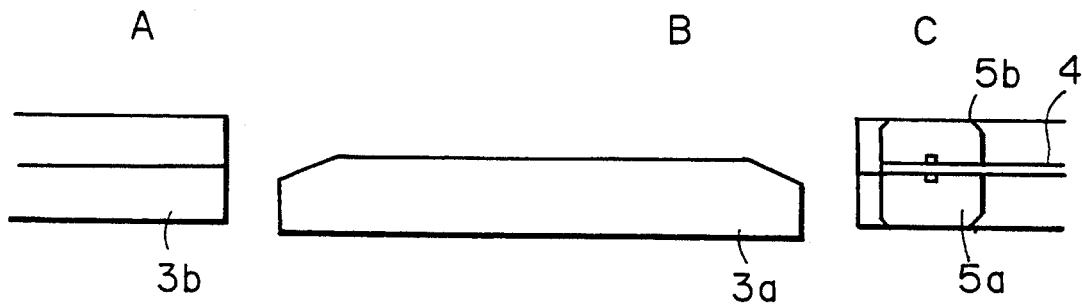

When bonding completes through the process steps above repeated for the required times, as shown in FIG. 30, the clamp is closed to hold the lead frame 4 and the fingers 5a and 5b are advanced to an expel position (third position) C by rotation of the screw shaft 7 (time T7 in FIG. 18). After the lead frame 4 is expelled, the clamp 5c is opened and returned to its initial position in readiness for processing on the next lead frame.

As heretofore described, the apparatus 200 requires that the sensor 8 detects the position of the lead frame 4 and transportation of the lead frame 4 is controlled in accordance with the detection signal from the sensor 8. Hence, the apparatus 200 has an excellent transportation accuracy. In addition, since the lead frame 4 is fixed at least by either one of the clamp 5c and the frame presser member 2, the lead frame 4 would not be displaced, which especially contributes to the enhanced transportation accuracy.

<2. Second Preferred Embodiment>

Figure 32:
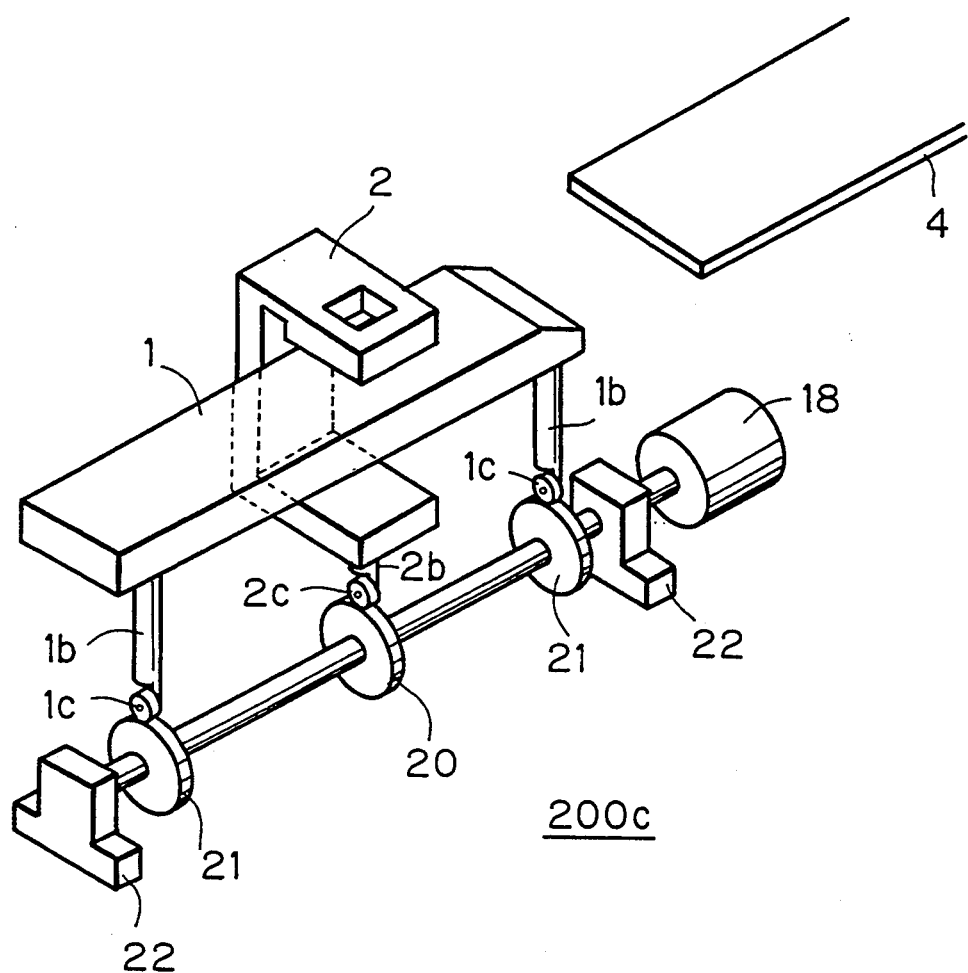
FIG. 32 is a schematic diagram of a vertical drive mechanism for driving a heat block and the frame presser member according to the preferred embodiment of the present invention.

FIG. 32 is a diagram of a vertical drive mechanism 200c which may be used instead of the vertical drive mechanism 100b of FIG. 15. Unlike in the bonding apparatus 200 of the first preferred embodiment wherein the vertical drive mechanism 100b of FIG. 15 moves the movable rails 3a upward and downward to thereby prevent frictional contact of the lead frame 4 and the heat block 1, in the apparatus of the second preferred embodiment, the vertical drive mechanism 200c shown in FIG. 32 drives the heat block 1 so that the heat block 1 moves downward from the vertical bonding position.

In FIG. 32, a shaft 1b fixedly depends from the heat block 1. A bearing 1c is disposed for free rotation to face the other end of the shaft 1b which depends from the heat block 1. The other elements and members shown in FIG. 32 are identical to those shown in FIG. 15. Hence, parts similar to those previously described with reference to FIG. 15 are denoted by the same reference numerals.

In the second preferred embodiment, unlike the first preferred embodiment, it is not necessary that the rails are disassembled into the movable rails 3a and the guide rails 3b. Instead, a pair of fixed transportation guide rails is used. The actions in the apparatus employing the mechanism 200c are as shown in the graph of FIG. 18 where the vertical movement of the movable rails 3a corresponds to vertical movement of the heat block 1. In understanding the second preferred embodiment, it is important to note that the absolute "uppermost" vertical position and the absolute "lowermost" vertical position of FIG. 18 in the second preferred embodiment are not the same as those of the first preferred embodiment. That is, in the first preferred embodiment, the vertical bonding position is considered as the "lowermost" position of the movable rails 3a and the vertical position of the movable rails 3a is measured upward from the "lowermost" vertical bonding position. On the other hand, in the second preferred embodiment, the vertical bonding position is considered as the "uppermost" position of the heat block 1 and the vertical position of the heat block 1 is measured downward from the "uppermost" vertical bonding position.

Further, the clamp 5c is not necessarily movable in a vertical direction in the second preferred embodiment. The reason why the clamp 5c is movable up and down to a certain extent in the first preferred embodiment is that when the movable rails 3a move upward so that the lead frame 4 is partially pushed and bent upward, the clamp 5c needs to slide upward following this movement. Differently from the first preferred embodiment, frictional contact of the lead frame 4 and the heat block 1 is avoided by sliding down of the heat block 1 in the second preferred embodiment. Hence, by holding the lead frame 4 by the clamp 5c and moving the clamp 5c in a horizontal direction from above the transportation guide rails to above the heat block 1, the lead frame 4 is advanced on the transportation guide rails to above a predetermined point designated on the heat block 1.

Following this, the vertical drive mechanism drives the heat block 1 to slide upward from the transportation plane while the clamp 5c stays still holding the lead frame 4 above the predetermined point on the heat block 1. The lead frame 4 is then placed on the predetermined point on the heat block 1 and heated thereon.

Hence, on the way to the predetermined point which is designated on the heat block 1, the lead frame 4 would not frictionally contact the heat block 1. In addition, just one movement of the clamp 5c along a straight line is all what is needed to feed the lead frame 4 to the predetermined point, and hence, clamping actions of the clamp 5c are not necessary. This presents effects similar to those promised in the first preferred embodiment.

<3. Modifications>

(1) A plurality of sensors may be arranged in the direction X in which a lead frame is to be fed, in which case transportation of the lead frame is even more accurately controlled since the X-direction position of the hole 4h is sensed at a plurality of sensing positions.

(2) Processing other than bonding on the lead frame may be attained by the disclosed apparatus. That is, the invention is applicable to any apparatus which feeds a lead frame and performs certain processing on the lead frame.

While the invention has been described in detail, the foregoing description is in all aspects illustrative and not restrictive. It is understood that numerous other modifications and variations can be devised without departing from the scope of the invention.

We claim:

1. A method for feeding a lead frame from a first point toward a second point along a transportation line which extends from said first to said second points, executing processing on said lead frame while holding said lead frame in a processing space which is provided in said transportation line, and for further feeding said lead frame to said second point along said transportation line, said method comprising the steps of:
  (a) providing a nip mechanism for firmly holding said lead frame, said nip mechanism having a motion stroke which includes at least a distance which extends from a first position to a second position along said transportation line, said first position being defined between said first point and said processing space, said second position being defined at said processing space;
  (b) positioning a sensor at a point in said transportation line;
  (c) feeding said lead frame to said first point;
  (d) holding said lead frame at said first position by said nip mechanism, and then moving said nip mechanism along said transportation line toward said second position as said nip mechanism holds said lead frame;
  (e) detecting a to-be-detected portion of said lead frame by said sensor;
  (f) moving said nip mechanism a distance to said second position based upon detection of said to-be-detected portion of said lead frame by said sensor so as to position a portion-to-be-processed of said lead frame at said processing space;
  (g) stopping movement along said transportation line of said nip mechanism to position said nip mechanism at said processing space concurrently with the arrival of said portion-to-be-processed of said lead frame at said processing space;
  (h) executing said processing on said portion-to-be-processed of said lead frame within said processing space; and
  (i) holding said lead frame by said nip mechanism and further moving said nip mechanism along said transportation line toward said second point.

2. The method of claim 1, wherein
said lead frame includes a plurality of portions-to-be-processed including a first portion-to-be-processed and a second portion-to-be-processed and,
said method further comprises the step of (j) disposing a lead frame fix mechanism in said processing space, said lead frame fix mechanism temporarily fixing the position of said lead frame and,
said step (f) includes the step of (f-1) feeding said first portion-to-be-processed to said processing space and,
said step (h) includes the steps of:
  (h-1) fixing said lead frame by said lead frame fix mechanism and thereafter releasing said lead frame from the hold of said nip mechanism;
  (h-2) executing said processing on said first portion-to-be-processed while fixing said lead frame by said lead frame fix mechanism;
  (h-3) returning said nip mechanism to said first position;
  (h-4) holding said lead frame by said nip mechanism;

(h-5) releasing said lead frame from said lead frame fix mechanism;

(h-6) moving said nip mechanism toward said second position along said transportation line as said nip mechanism holds said lead frame;

(h-7) fixing said lead frame by said lead frame fix mechanism and thereafter releasing said lead frame from the hold of said nip mechanism; and (h-8) executing said processing on said second portion-to-be-processed while fixing said lead frame by said lead frame fix mechanism.

3. The method of claim 2, wherein said step (i) includes the step of (i-1) holding said lead frame by said nip mechanism and thereafter moving said nip mechanism along said transportation line to a third position which is defined between said processing space and said second point whereby said lead frame is discharged to said second point.

4. The method of claim 3, wherein said processing includes bonding of said lead frame and a semiconductor chip which is mounted on said lead frame and, wherein said method further comprises the steps of:

(k) disposing first paired stationary guide rails between said first point and said processing space along said transportation line;

(l) disposing second paired stationary guide rails between said processing space and said second point along said transportation line;

(m) disposing a heat block in said processing space, said heat block having a top surface which is substantially flush with said transportation line; and (n) disposing paired movable guide rails along said transportation line, said paired movable guide rails being movable in a vertical direction upward above and downward below said heat block and, wherein said step (f) further includes the step of (f-2) moving said paired movable guide rails and said nip mechanism upward so that the top surfaces of said paired movable guide rails and a holding position of said lead frame by said nip mechanism are in higher positions than guide planes of said first and said second paired stationary guide rails, and wherein said step (g) includes the step of (g-1) moving said paired movable guide rails and said nip mechanism downward so that the top surfaces of said paired movable guide rails and the holding position of said lead frame by said nip mechanism are in positions substantially flush with or lower than the guide planes of said first and said second paired stationary guide rails.

5. The method of claim 3, wherein said processing includes bonding of said lead frame and a semiconductor chip which is mounted on said lead frame and, said method further comprises the steps of:

(k) disposing guide rails between said first point and said second point along said transportation line;

(l) disposing a heat block in said processing space, said heat block being movable in a vertical direction; and said step (f) further includes the step of (f-2) moving said heat block so that a top surface of said heat block is lower than said transportation line, and said step (g) further includes the step of (g-2) moving said heat block so that a top surface of said heat block is substantially flush with said transportation line.

6. An apparatus for feeding a lead frame from a first point toward a second point along a transportation line which extends from said first to said second points, executing processing on said lead frame while holding said lead frame in a processing space which is provided in said transportation line, and for further feeding said lead frame to said second point along said transportation line, said apparatus comprising:

(a) nip means for firmly holding said lead frame, said nip means having a motion stroke which includes at least a distance which extends from a first position to a second position along said transportation line, said first position being defined between said first point and said processing space, said second position being defined at said processing space;

(b) drive means for moving said nip means along said transportation line;

(c) first control means for generating and giving a first control signal to said nip means at said first position to hold said lead frame;

(d) second control means for generating and giving a second control signal to said drive means to move said nip means along said transportation line toward said second position as said hid means holds said lead frame;

(e) a sensor located at a location on said transportation line, said sensor detecting a to-be-detected portion of said lead frame and generating a detection signal;

(f) third control means for generating and giving, in response to said detection signal, a third control signal to said drive means to move said nip means along said transportation line a distance based upon detection of said to-be-detected portion of said lead frame by said sensor toward said second position and to stop said nip means at said processing space whereby a portion-to-be-processed of said lead frame enters said processing space; and (g) processing means disposed in said processing space for processing said portion-to-be-processed of said lead frame upon arrival of said portion-to-be-processed of said lead frame at said processing space.

7. The apparatus of claim 6, wherein a plurality of portions-to-be-processed are defined in said lead frame and, said apparatus further comprises:

(h) lead frame fix means disposed in said processing space, said lead frame fix means temporarily fixing the position of said lead frame; and (i) fourth control means for generating and giving a fourth control signal to said nip means and said lead frame fix means to enable said lead frame to be at least one of held by said nip means and fixed by said lead frame fix means.

8. The apparatus of claim 7, further comprising: (j) fifth control means for generating and giving a fifth control signal to said drive means to move said nip means along said transportation line to a third position which is defined between said processing space and said second point while said nip means holds said lead frame which has undergone said processing, whereby said lead frame is discharged to said second point.

9. The apparatus of claim 8, wherein said processing includes bonding of said lead frame and a semiconductor chip which is mounted on said lead frame and,
said apparatus further comprising:
(k) first paired stationary guide rails disposed between said first point and said processing space along said transportation line;
(l) second paired stationary guide rails disposed between said processing space and said second point along said transportation line;
(m) a heat block disposed in said processing space, said heat block having a top surface which is substantially flush with said transportation line; and
(n) paired movable guide rails disposed along said transportation line, said paired movable guide rails being movable in a vertical direction upward above and downward below said heat block.

10. The apparatus of claim 8, wherein said processing includes bonding of said lead frame and a semiconductor chip which is mounted on said lead frame and,
said apparatus further comprising:
(k) guide rails disposed between said first point and said second point along said transportation line, said guide rails guiding said lead frame; and
(l) a heat block disposed in said processing space, said heat block being movable in a vertical direction.

* * * * *